(12) United States Patent
Mohandas

(10) Patent No.: US 11,698,747 B2
(45) Date of Patent: Jul. 11, 2023

(54) PULSE AMPLITUDE MODULATION (PAM) FOR MULTI-HOST SUPPORT IN A MEMORY SUB-SYSTEM

(71) Applicant: Micron Technology, Inc., Boise, ID (US)

(72) Inventor: Alex Mohandas, Thiruvananthapuram (IN)

(73) Assignee: Micron Technology, Inc., Boise, ID (US)

( * ) Notice: Subject to any disclaimer, the term of this patent is extended or adjusted under 35 U.S.C. 154(b) by 57 days.

(21) Appl. No.: 17/088,364

(22) Filed: Nov. 3, 2020

(65) Prior Publication Data

US 2022/0137857 A1 May 5, 2022

(51) Int. Cl.
*G06F 3/06* (2006.01)

(52) U.S. Cl.
CPC .......... *G06F 3/0655* (2013.01); *G06F 3/0604* (2013.01); *G06F 3/0679* (2013.01)

(58) Field of Classification Search
CPC .............................. G06F 3/0655; G06F 3/0604
See application file for complete search history.

(56) References Cited

U.S. PATENT DOCUMENTS

| | | | |
|---|---|---|---|
| 9,239,783 B2 | 1/2016 | Prins et al. | |
| 10,410,694 B1 | 9/2019 | Arbel et al. | |
| 10,454,588 B1 * | 10/2019 | Liu | H04B 10/5161 |
| 10,734,081 B1 | 8/2020 | Blatt et al. | |
| 2014/0321863 A1 | 10/2014 | Diab | |
| 2015/0222366 A1 * | 8/2015 | Asmanis | H04B 10/504 398/186 |
| 2018/0005670 A1 | 1/2018 | Lee et al. | |
| 2018/0332373 A1 * | 11/2018 | Wey | H04Q 11/0067 |
| 2019/0103148 A1 | 4/2019 | Hasbun et al. | |

FOREIGN PATENT DOCUMENTS

WO WO-2022098663 A1 5/2022

OTHER PUBLICATIONS

"International Application Serial No. PCT/US2021/057761, International Search Report dated Feb. 15, 2022", 4 pgs.
"International Application Serial No. PCT/US2021/057761, Written Opinion dated Feb. 15, 2022", 4 pgs.
Bjerke, Bjorn A., "Pulse Amplitude Modulation", Wiley Encyclopedia of Telecommunications abstract only, (Apr. 15, 2003), 2 pages.

(Continued)

*Primary Examiner* — Gary W. Cygiel
(74) *Attorney, Agent, or Firm* — Schwegman Lundberg & Woessner, P.A.

(57) ABSTRACT

First data is received from a first host system and second data is received from a second host system. A composite signal is generated to represent both the first data received from the first host system and the second data received from the second host system. The composite signal comprises a series of signal pulses at multiple levels. A first level and a second level in the composite signal represent values from the first data received from the first host system. A third level and a fourth level in the composite signal represent values from the second data received from the second host system. The composite signal is provided to the memory device.

20 Claims, 7 Drawing Sheets

(56) References Cited

OTHER PUBLICATIONS

Madany, Waleed, "Adaptive timing correction technique for pulse-amplitude and pulse-position modulation interface", International Journal of Electronics vol. 106 Issue 12, (Jun. 29, 2019), 5 pages.
Toshiba, "Toshiba Memory Corporation Develops New Bridge Chip using PAM 4 to Boost SSD Speed and Capacity", Businesswire, (Feb. 21, 2019), 3 pages.

\* cited by examiner

US 11,698,747 B2

PULSE AMPLITUDE MODULATION (PAM) FOR MULTI-HOST SUPPORT IN A MEMORY SUB-SYSTEM

TECHNICAL FIELD

Embodiments of the disclosure relate generally to memory sub-systems and, more specifically, to using pulse amplitude modulation (PAM) in a memory sub-system to support multiple host systems.

BACKGROUND

A memory sub-system can include one or more memory devices that store data. The memory components can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various example embodiments of the disclosure.

DETAILED DESCRIPTION

Figure 1:
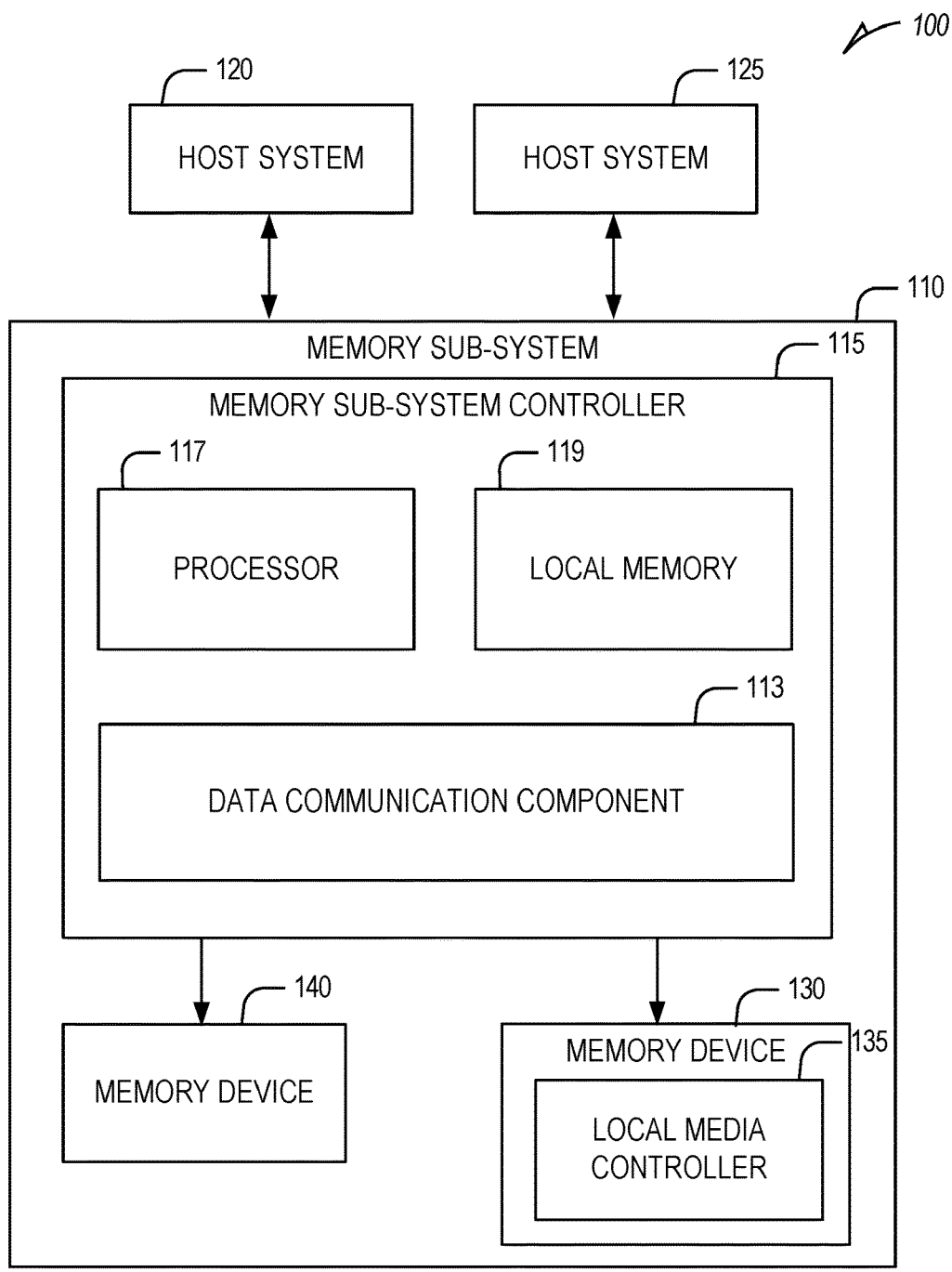
FIG. 1 illustrates an example computing system that includes a memory sub-system, in accordance with some embodiments of the present disclosure.

Aspects of the present disclosure are directed to use of pulse amplitude modulation (PAM) in a memory sub-system to support multiple host systems. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of a non-volatile memory device is a negative-and (NAND) memory device. Other examples of non-volatile memory devices are described below in conjunction with FIG. 1. Some memory devices, such as NAND memory devices, include an array of memory cells (e.g., flash cells) to store data. Each cell includes a transistor, and within each cell, data is stored as the threshold voltage of the transistor, based on the logical value of the cell (e.g., 0 or 1). Memory cells in these devices can be grouped as pages that can refer to a logical unit of the memory device used to store data. For example, memory cells in NAND memory devices are connected horizontally at their control gates to a word line to form a page. With some types of memory devices (e.g., NAND), pages are grouped to form blocks (also referred to herein as "memory blocks").

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system.

Memory sub-systems often support multiple host systems. However, a typical memory device can accept access requests from only a single host system at a time. Memory sub-systems traditionally employ time consuming bus arbitration techniques to determine which of the multiple host systems is able to issue commands for the memory device. At each arbitration cycle, the host system that wins the arbitration gets the opportunity to issue commands for the memory device, and while the winning host system is issuing commands or providing data, the other host systems must wait at least until the winning host system completes its transaction before their own commands can be issued.

Aspects of the present disclosure address issues with conventional techniques for supporting multiple host systems in a memory sub-system by using pulse amplitude modulation (PAM) along and time division multiplexing for parallel transmission of data to form multiple host systems to a single memory device. For example, unique voltage levels for transmitting data are assigned per host system thereby allowing the memory device to uniquely identify the data provided by each host system. Using time division multiplexing, data from multiple host systems can be transmitted to the memory device in parallel without one host system having to wait for transaction completion by another host system. That is, a single time division multiplexed PAM signal that represents data from multiple host systems is transmitted to a memory device. Because the signal is already pulse amplitude modulated, the memory device is able to efficiently demultiplex the signal and identify the host system from which data in the signal originated.

Hence, utilizing PAM in conjunction with time division multiplexing for a data transmission technique eliminates the need for traditional bus arbitration techniques that cause wait times for host systems waiting for another host system to complete a transaction.

As an example of the forgoing, consider a 5V data transmission lane. Normally, 0V is used to represent a data bit with a binary value of '0' and 5V is used to represent a data bit with a value of '1'. Conventionally, at a given point of time, only one host system can transfer data to a memory device of a memory sub-system. Using the data communication technique referenced above and described in further detail below, the 5V is split into multiple levels and the levels are assigned to the multiple host systems. For example, 5V can be split into the following levels: 0V, 1.7V, 3.3V and 5V. For a first host system, 0V can be used to represent a bit value of '0' and 3.3V can be used to represent a bit value of '1'. For a second host system, 1.7V can be used to represent a bit value of '0' and 5V can be used to represent a bit value of '1'.

FIG. 1 illustrates an example computing system 100 that includes a memory sub-system 110, in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include multiple host systems that are coupled to one or more memory sub-systems 110. In some embodiments, the host system 120 is coupled to different types of memory sub-system 110. FIG. 1 illustrates example host systems 120 and 125 that are coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

Each of the host systems 120 and 125 can include a processor chipset and a software stack executed by the processor chipset. The processor chipset can include one or more cores, one or more caches, a memory controller (e.g., NVDIMM controller), and a storage protocol controller (e.g., peripheral component interconnect express (PCIe) controller, serial advanced technology attachment (SATA) controller). The host systems 120 and 125 use the memory sub-system 110, for example, to write data to the memory sub-system 110 and read data from the memory sub-system 110.

The host systems 120 and 125 can be coupled to the memory sub-system 110 via a host interface. Examples of a host interface include, but are not limited to, a SATA interface, a PCIe interface, USB interface, Fibre Channel, Serial Attached SCSI (SAS), Small Computer System Interface (SCSI), a double data rate (DDR) memory bus, a DIMM interface (e.g., DIMM socket interface that supports Double Data Rate (DDR)), Open NAND Flash interface (ONFI), Double Data Rate (DDR), Low Power Double Data Rate (LPDDR), or any other interface. The host interface can be used to transmit data between the host systems 120 and 125 and the memory, sub-system 110. Either of the host systems 120 and 125 can further utilize an NVM Express (NVMe) interface to access components (e.g., memory devices 130) when the memory sub-system 110 is coupled with the host system 120 or 125 by the PCIe interface. The host interface can provide an interface for passing control, address, data, and other signals between the memory sub-system 110 and the host systems 120 and 125. FIG. 1 illustrates a memory sub-system 110 as an example. In general, the host systems 120 and 125 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include NAND type flash memory and write-in-place memory, such as a three-dimensional (3D) cross-point memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and 3D NAND.

Each of the memory devices 130 can include one or more arrays of memory cells. One type of memory cell, for example, single level cells (SLC), can store one bit per cell. Other types of memory cells, such as multi-level cells (MLCs), triple level cells (TLCs), quad-level cells ((PLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. For example, memory cells in NAND memory devices are connected horizontally at their control gates to a word line to form a page. With some types of memory (e.g., NAND), pages can be grouped to form blocks. Additionally, word lines within a memory device can be organized into multiple word line groups, each of which includes one or more word lines, though each word line group includes fewer word lines than are included in a block.

Although non-volatile memory components such as NAND type flash memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), NOR flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application-specific integrated circuit (AMC), etc.), or other suitable processor.

The memory sub-system controller 115 can include a processor 117 (processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host systems 120 and 125.

In some embodiments, the local memory 119 can include memory registers storing memory pointers, fetched data, and the like. The local memory 119 can also include ROM for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host systems 120 and 125 and can convert the commands or operations into instructions or appropriate commands to achieve the desired access to the memory devices 130 and/or the memory device 140. The memory sub-system controller 115 can be responsible for other operations such as wear leveling operations, garbage collection operations, error detection and ECC operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host systems 120 and 125 via the physical host interface. The host interface circuitry can convert the commands received from the host systems 120 and 125 into command instructions to access the memory devices 130 and/or the memory device 140 and convert responses associated with the memory devices 130 and/or the memory device 140 into information for the host system 120 and 125.

In some embodiments, the memory devices 130 include local media controller 135 that operates in conjunction with memory sub-system controller 115 to execute operations on one or more memory cells of the memory devices 130.

The memory sub-system 110 also includes a data communication component 113 to facilitate transmission of data from the host systems 120 and 125 to the memory devices 130 and 140. To support parallel transmission of data from multiple host systems, the data communication component 113 uses pulse amplitude modulation (PAM) along and time division multiplexing. For example, a single time division multiplexed PAM signal that represents data from both host systems 120 and 125 can be transmitted to one of the memory devices 130 or 140, and because the signal is already pulse amplitude modulated, the receiving memory device is able to efficiently identify data values and the host system from which the data originated.

The data communication component 113 can include one or more hardware components such as an expander, a switch, or a multiplexer. In some embodiments, the memory sub-system controller 115 includes at least a portion of the data communication component 113. For example, the memory sub-system controller 115 can include a processor 117 (processing device) configured to execute instructions stored in local memory 119 for performing the operations described herein. In some embodiments, at least a portion of the data communication component 113 is part of the host systems 120 and 125, an application, or an operating system.

Figure 2A:
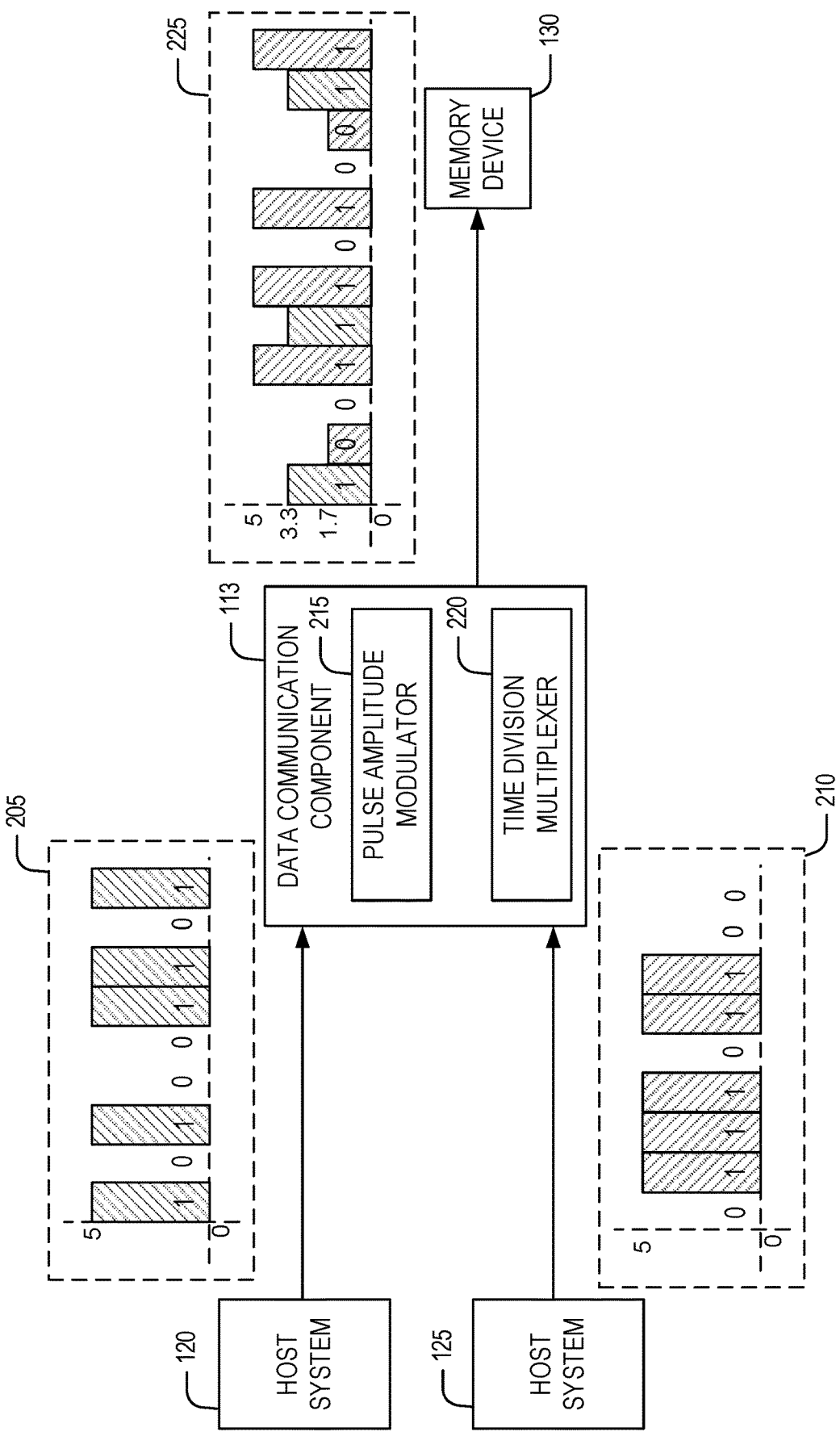
FIGS. 2A and 2B illustrate interactions between components of the memory sub-system in communicating data from multiple host systems using PAM, in accordance with some embodiments of the present disclosure.
Figure 2B:
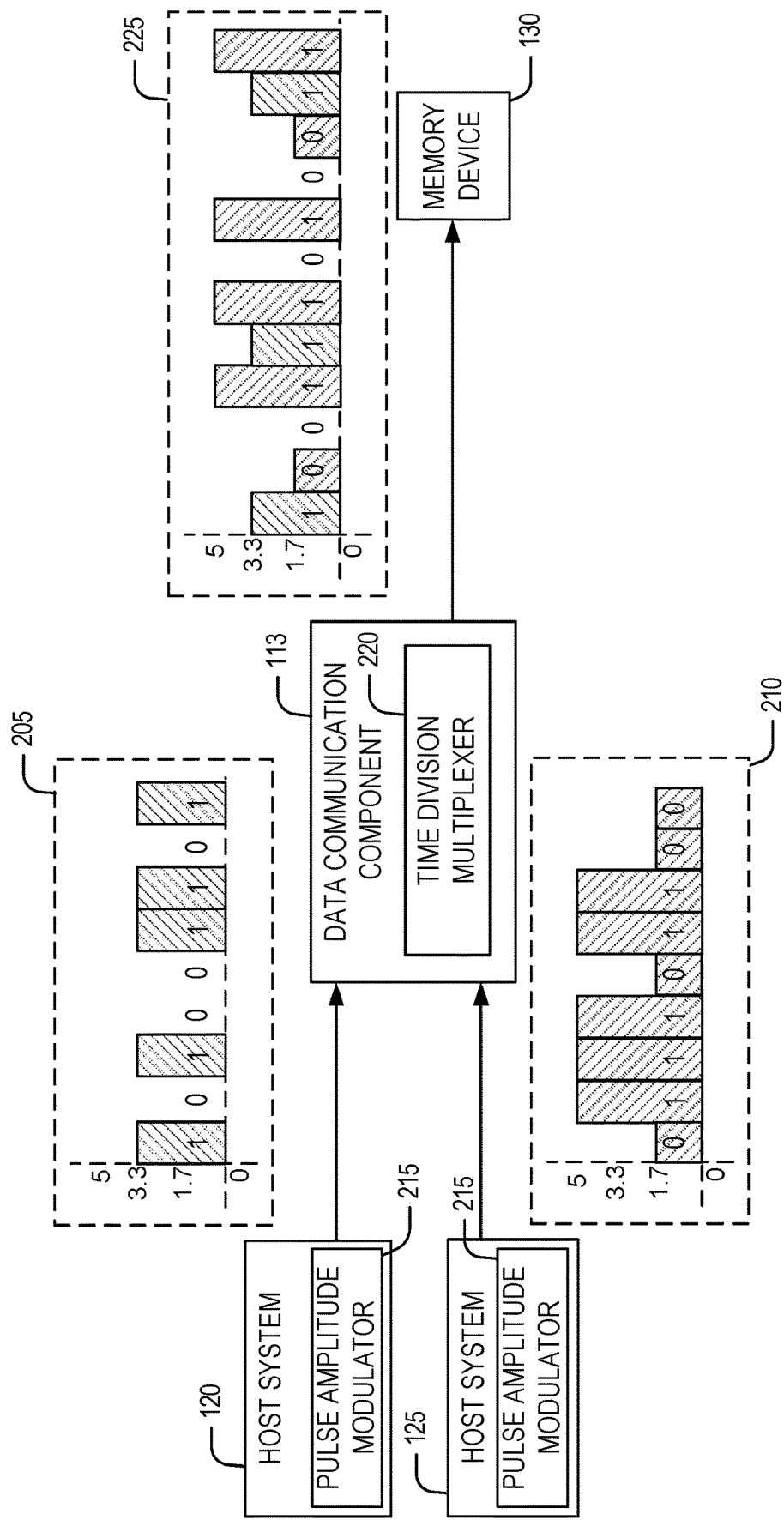

FIGS. 2A and 2B illustrate interactions between components of the memory sub-system 110 in communicating data from multiple host systems using PAM, in accordance with some embodiments of the present disclosure. With reference to FIG. 2A, the data communication component 113 can be responsible for performing PAM on data received from the host systems 120 and 125, in some embodiments. As shown, the host system 120 provides data 205 for communication to the memory device 130 via the data communication component 113 and the host system 125 provides data 210 for communication to the memory device 130 via the data communication component 113. The data 205 can be encoded in a first signal and the data 210 can be encoded in a second signal. In both the first and second signals, values are encoded as signal pulse amplitudes. As shown, the signal pulse amplitudes in both the first and second signal correspond to one of two levels. For example, values of "0" in the data 205 and 210 are represented using pulse amplitudes of 0V (first level) in the first and second signals, and values of "1" are represented using pulse amplitudes of 5V (second level).

A pulse amplitude modulator 215 in the data communication component 113 generates a first intermediate PAM signal based on data 205 and a second intermediate PAM signal based on data 210. Within each of the intermediate PAM signals, values in the data 205 and 210 are once again represented by signal pulse amplitudes. However, in generating the intermediate PAM signals, the pulse amplitude modulator 215 can convert one or more voltage levels in the first and second signals to a different voltage level selected from a larger set of voltage levels that allows data from multiple hosts to be combined into a single signal. For example, the pulse amplitude modulator 215 can assign first and second levels to represent values from data 205 and assign third and fourth levels to represent values from data 210.

As a more specific example, the pulse amplitude modulator 215 can generate the first intermediate PAM signal such that values of "0" in data 205 are represented by signal pulses with a 0V amplitude (the first level) and values of "1" in data 205 are represented by signal pulses with a 3.3V amplitude (the second level). Further, the pulse amplitude modulator 215 can generate the second intermediate PAM signal such that values of "0" in data 210 are represented by signal pulses with a 1.7V amplitude (the third level); and values of "1" in data 210 are represented by signal pulses with a 5V amplitude (the fourth level).

A time division multiplexer 220 combines the first and second PAM signals to generate a composite signal 225. The composite signal 225 is a PAM signal in which both data 205 and 210 are encoded in amplitudes of a series of signal pulses. The amplitudes of the signal pulses again correspond to the multiple levels discussed above in reference to generating the first and second PAM signals. Given that the composite signal 225 is generated by multiplexing the first and second PAM signals, signal pulse amplitudes corresponding to: the first level (e.g., 0V) represent values of "0" in data 205 from host system 120; the second level (e.g., 3.3V) represent values of "1" in data 205 from host system 120; the third level (e.g., 1.7V) represent values of "0" in data 210 from host system 125; and the fourth level (e.g., 5V) represent values of "1" in data 210 from host system 125.

The data communication component 113 transmits the composite signal 225 to the memory device 130. The memory device 130, in turn, demultiplexes the composite signal 225 and separately identifies values from data 205 and data 210 based on the levels uniquely assigned to each of the host systems 120 and 125. In particular, the memory device 130 identifies values from data 205 based on pulse amplitudes corresponding to the first and second levels and identifies values from data 210 based on pulse amplitudes corresponding to the third and fourth levels.

With reference to FIG. 2B, in some embodiments, each of the host systems 120 and 125 are individually responsible for performing PAM on data before providing the data to the memory sub-system 110. For example, as shown in FIG. 2B, each of host systems 120 and 125 include the pulse amplitude modulator 215. Consistent with these embodiments, in communicating the data 205, the host system 120 provides a first intermediate PAM signal that represents the data 205 using a series of signal pulses with amplitudes at either the first or second level (e.g., 0V or 3.3V), and in communicating the data 210, the host system 125 provides a second intermediate PAM signal that represents the data 210 using a series of signal pulses with amplitudes at either the third or fourth level (e.g., 1.7V or 5V).

As with the embodiments discussed above in reference to FIG. 2A, the time division multiplexer 220 combines the first and second intermediate PAM signals to produce the composite signal 225, which is transmitted to the memory, device 130.

It shall be appreciated that although the parallel transmission of data is described above in reference to two host systems, the inventive subject matter is not limited to two host systems, and in other embodiments, parallel data transmission of additional host systems can be supported. For example, in some embodiments, the composite signal transmitted to the memory device 130 can further comprise signal pulses at a fifth level and a sixth level to represent data received from a third host system.

Figure 3:
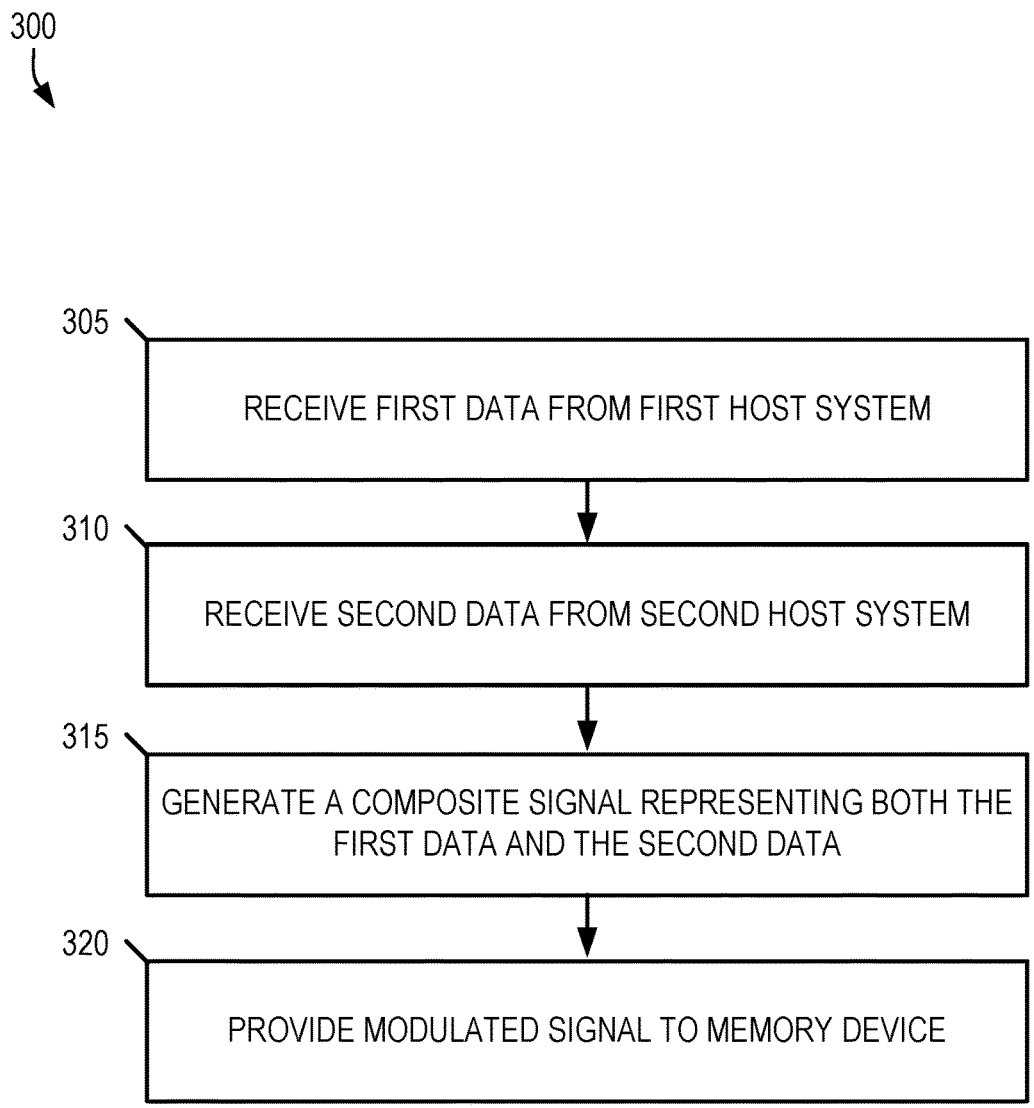
FIG. 3-5 are flow diagrams illustrating an example method for data communication within a memory sub-system using PAM to support multiple host systems, in accordance with some embodiments of the present disclosure.
Figure 4:
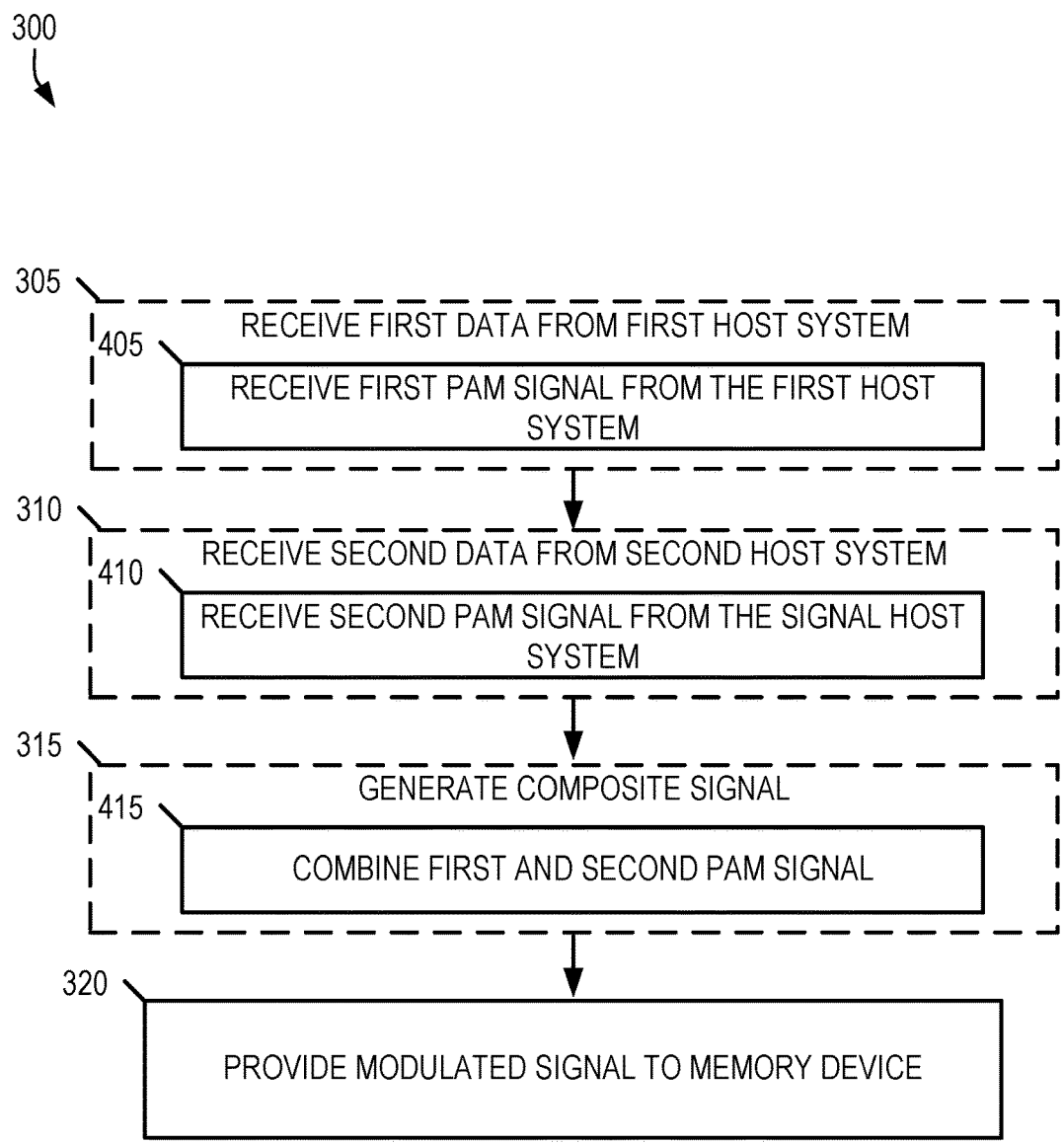
Figure 5:
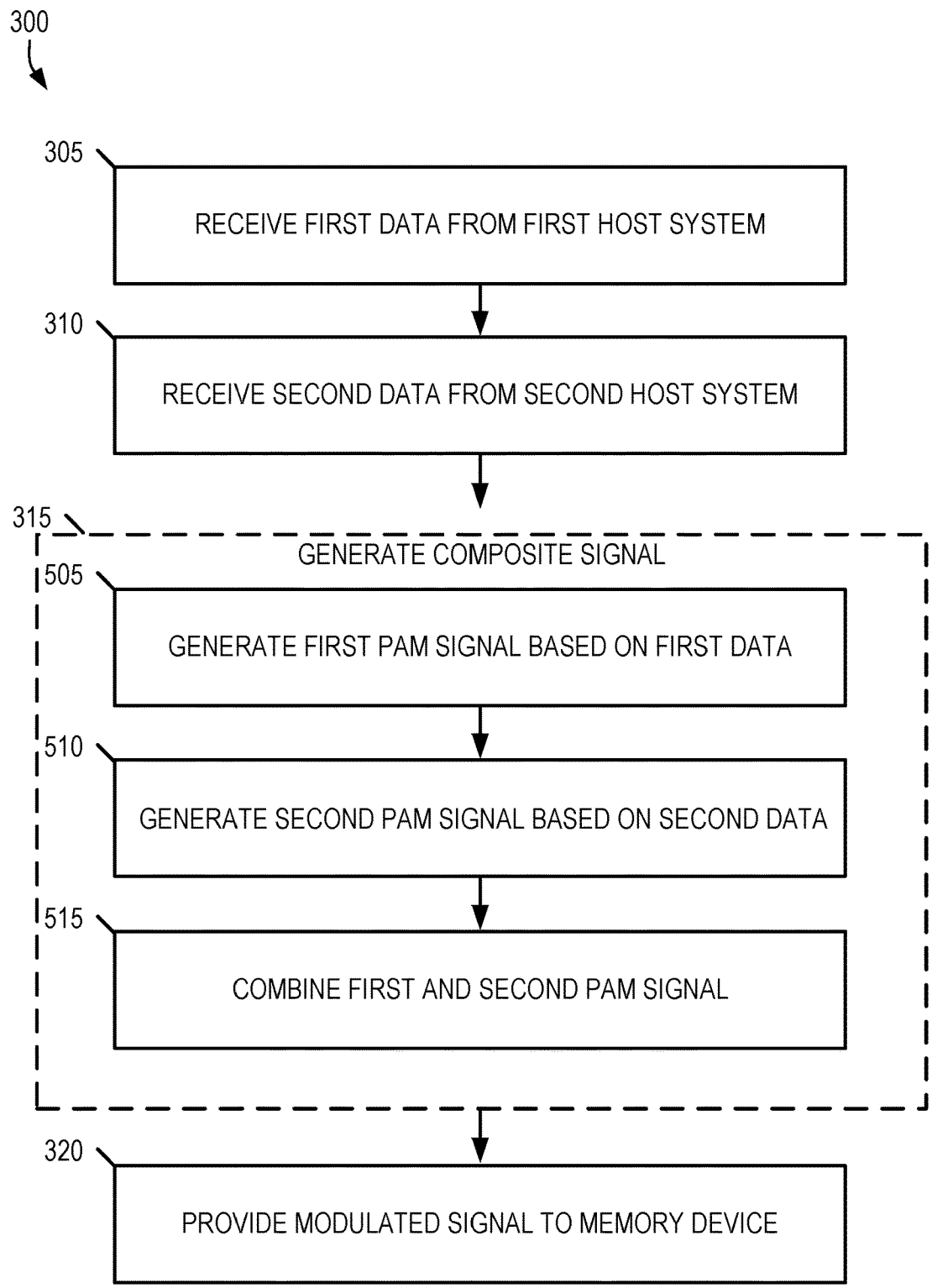

FIG. 3-5 are flow diagrams illustrating an example method for data communication within a memory sub-system using PAM to support multiple host systems, in accordance with some embodiments of the present disclosure. The method 300 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 300 is performed by the data communication component 113 of FIG. 1. Although processes are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the processing device receives first data (e.g., data 205) from a first host system (e.g., the host system 120) and at operation. 310, the processing device receives second data (e.g., data 210) from a second host system (e.g., the host system 125).

At operation 315, the processing device generates a composite signal (e.g., composite signal 225) that represents a combination of the first data and the second data. More specifically, the composite signal is a PAM signal in which both the first and second data are encoded in amplitudes of a series of signal pulses.

Specifically, signal pulse amplitudes correspond to one of multiple levels (e.g., voltage levels). That is, the amplitude of a given signal pulse in the composite signal corresponds to one of multiple levels. For example, the composite signal can comprise a first level (e.g., 0V), a second level (e.g., 1.7V), a third level (e.g., 3.3V), and a fourth level (e.g., 5V).

Within the composite signal, the multiple levels are assigned to represent data values on a per-host basis. For example, a first level and a second level in the composite signal can represent values from the first data received from the first host system, and a third level and a fourth level in the composite signal can represent values received from the second data from the second host system. As a more specific example, in the composite signal: the first level (e.g., 0V) can represent binary values of '0' in the data from the first host system; the second level (e.g., 3.3V) can represent binary values of '1' in the data from the first host system; the third level (e.g., 1.7V) can represent binary values of '0' in the data from the second host system; and the fourth level (e.g., 5V) can represent binary values of '1' in the data from the second host system.

At operation 320, the processing device provides (e.g., transmits) the composite signal to a memory device (e.g., the memory device 130). The memory, device, in turn, identifies the first and second data from the composite signal. More specifically, the memory device identifies the first data based on the first and second level of pulses in the composite signal and identifies the second data based on the third and fourth level of pulses in the composite signal.

In some embodiments, the first and second host systems are responsible for performing the PAM on respective data values. Accordingly, as shown in FIG. 4, the method 300 can, in some embodiments, include operations 405, 410, and 415. Consistent with these embodiments, the operation 405 can be performed as part of operation 305 at which the processing device receives the first data from the first host system. At operation 405, the processing device receives a first PAM signal from the first host system. The first PAM signal represents the first data. More specifically, the first data is encoded in amplitudes of series of signal pulses. Within the first PAM signal, values in the first data are represented by either the first level (e.g., 0V) and the second level (e.g., 3.3.V), That is, signal pulse amplitudes in the first PAM signal correspond to either the first level or the second level. As an example, values of "0" in the first data are represented in the first PAM signal by pulse amplitudes of 0V and values of "1" in the first data are represented by pulse amplitudes of 3.3.V.

Consistent with these embodiments, the operation 405 can be performed as part of operation 310 at which the processing device receives the second data from the second host system. At operation 410, the processing device receives a second PAM signal from the second host system. The second PAM signal represents the second data. More specifically, the second data is encoded in amplitudes of series of signal pulses. Within the second PAM signal, values in the second data are represented by the third level (e.g., 1.7V) and the fourth level (e.g., 5.V). That is, signal pulse amplitudes in the second PAM signal correspond to either the third level or the fourth level. As an example, values of "0" in the second data are represented in the second PAM signal by pulse amplitudes of 1.7V and values of "1" in the second data are represented by pulse amplitudes of 5V.

Consistent with these embodiments, the operation 415 can be performed as part of operation 315 where the processing device generates the composite signal. Consistent with these embodiments, the processing device generates the composite signal by combining the first PAM signal received from the first host system and the second PAM signal received from the second host system. The processing device combines the first and second PAM signals using multiplexing. For example, the combining of the first and second PAM signals can include time division multiplexing the first and second PAM signals.

As shown in FIG. 5, the method 300 can, in some embodiments, include operations 505, 510, and 515. Consistent with these embodiments, the operations 505, 510, and 515 can be performed as part of the operation 315 where the processing device generates the composite signal.

At operation 505, the processing devices generates a first PAM signal based on the first data received from the first host system. Within the first PAM signal, the first data is encoded in amplitudes of series of signal pulses. Specifically, amplitudes of the pulses in the first PAM signal correspond either to the first level or the second level. That is, within the first PAM signal, values in the first data are represented by either the first level or the second level. Accordingly, in generating the first PAM signal, the processing device converts values in the data from the first host system into signal pulses with amplitudes at the first or second level. For example, values of "0" in the first data are represented in the first PAM signal by pulse amplitudes of 0V and values of "1" in the first data are represented by pulse amplitudes of 3.3.V.

The processing device generate a second PAM signal based on the second data received from the second host system (at operation 510). Within the second PAM signal, the second data is encoded in amplitudes of series of signal pulses. Specifically, amplitudes of the pulses in the second. PAM signal correspond to either the third level or the fourth level. That is, within the second PAM signal, values in the second data are represented by either the third level or the fourth level. Accordingly, in generating the second PAM signal the processing device converts values in the data from the second host system into signal pulses with amplitudes at the third or fourth level. For example, values of "0" in the first data are represented in the second PAM signal by pulse amplitudes of 1.7V and values of "1" in the second data are represented by pulse amplitudes of 5V.

The method 300 may then proceed to operation 515 where the processing device combines the first PAM signal received from the first host system and the second PAM signal received from the second host system. The processing device combines the first and second PAM signals using multiplexing. For example, the combining of the first and second PAM signals can include time division multiplexing the first and second PAM signals.

Described implementations of the subject matter can include one or more features, alone or in combination. It shall be appreciated that although the method 300 is described above in reference to facilitating parallel transmission of data from two host systems, the method 300 is not limited to two host systems, and in other embodiments, parallel data transmission of additional host systems can be supported. For example, in some embodiments, the composite signal transmitted to the memory device can further comprise signal pulses at a fifth level and a sixth level to represent data received from a third host system.

Described implementations of the subject matter can include one or more features, alone or in combination as illustrated below by way of example.

Example 1 is a system comprising: a memory device; and a processing device, operatively coupled with the memory device, to perform operations comprising: receiving first data from a first host system; receiving second data from a second host system; generating a composite signal that represents both the first data received from the first host system and the second data received from the second host system, the composite signal comprising a series of signal pulses at multiple levels, a first level and a second level in the multiple levels representing values in the first data received from the first host system, a third level and a fourth level in the multiple levels representing values in the second data received from the second host system; and providing the composite signal to the memory device.

Example 2 includes the system of example 1, wherein: receiving the first data from the first host system comprises receiving a first pulse amplitude modulated signal from the first host system that represents the first data, values in the first data are represented in the first pulse amplitude modulated signal by signal pulses at the first level and the second level; receiving the second data from the second host system comprises receiving a second pulse amplitude modulated signal from the second host system that represents the second data; and values in the second data are represented in the second pulse amplitude modulated signal by, signal pulses at the third level and the fourth level.

Example 3 includes the system of any one or more of Examples 1 or 2, wherein generating the composite signal comprises combining the first and second pulse amplitude modulated signals.

Example 4 includes the system of any one or more of Examples 1-3, wherein combining the first pulse amplitude modulated signal and second pulse amplitude modulated signal comprises time division multiplexing the first pulse amplitude modulated signal and second pulse amplitude modulated signal.

Example 5 includes the system of any one or more of Examples 1-4, wherein: the operations further comprise: generating a first signal based on the first data using the first level and the second level; and generating a second signal based on the second data using the third level and the fourth level; the generating of the composite signal comprises time division multiplexing the first signal and the second signal.

Example 6 includes the system of any one or more of Examples 1-5, wherein: values in the first data are represented in the first signal by signal pulses at the first level and the second level; and values in the second data are represented in the second signal by signal pulses at the third level and the fourth level.

Example 7 includes the system of any one or more of Examples 1-6, wherein: the first level corresponds to a first value in the first data received from the first host system; the second level corresponds to a second value in the first data received from the first host system; the third level corresponds to the first value in the second data received from the second host system; and the fourth level corresponds to the second value in the second data received from the second host system.

Example 8 is a method comprising: receiving, by a processing device, first data from a first host system to provide to a memory device; receiving, by the processing device, second data from a second host system to provide to the memory, device; generating a composite signal that represents both the first data received from the first host system and the second data received from the second host system, the composite signal comprising a series of signal pulses at multiple levels, a first level and a second level in the multiple levels representing values in the first data received from the first host system, a third level and a fourth level in the multiple levels representing values in the second data received from the second host system; and providing the composite signal to the memory device.

Example 9 includes the method of example 8, wherein: receiving the first data from the first host system comprises receiving a first pulse amplitude modulated signal from the first host system that represents the first data, values in the first data are represented in the first pulse amplitude modulated signal by signal pulses at the first level and the second level; receiving the second data from the second host system comprises receiving a second pulse amplitude modulated signal from the second host system that represents the second data; and values in the second data are represented in the second pulse amplitude modulated signal by, signal pulses at the third level and the fourth level.

Example 10 includes the method of any one or more of Examples 8 or 9, wherein generating the composite signal comprises combining the first and second pulse amplitude modulated signals.

Example 11 includes the method of any one or more of Examples 8-10, further comprising: generating a first signal based on the first data using the first level and second level; and generating a second signal based on the second data using the third level and the fourth level, wherein the generating of the composite signal comprises time division multiplexing the first signal and the second signal.

Example 12 includes the method of any one or more of Examples 8-11, wherein: the first data is represented in the first signal by signal pulses at the first level and the second level; and the second data is represented in the second signal by signal pulses at the third level and the fourth level.

Example 13 includes the method of any one or more of Examples 8-12, wherein: the first level corresponds to a first value in the first data received from the first host system; the second level corresponds to a second value in the first data received from the first host system; the third level corresponds to the first value in the second data received from the second host system; and the fourth level corresponds to the second value in the second data received from the second host system.

Example 14 includes the method of any one or more of Examples 8-13, wherein the composite signal further comprises signal pulses at a fifth level and a sixth level representing values from third data received from a third host system.

Example 15 is a computer-readable storage medium comprising instructions that, when executed by a processing device, configure the processing device to perform operations comprising: receiving first data from a first host system to provide to a memory device; receiving second data from a second host system to provide to the memory device; generating a composite signal that represents both the first data received from the first host system and the second data received from the second host system, the composite signal comprising a series of signal pulses at multiple levels, a first level and a second level in the multiple levels representing values in the first data received from the first host system, a third level and a fourth level in the multiple levels representing values in the second data received from the second host system; and providing the composite signal to the memory device.

Example 16 includes the computer-readable storage medium of Example 15, wherein receiving the first data from the first host system comprises receiving a first pulse amplitude modulated signal from the first host system that represents the first data, values in the first data are represented in the first pulse amplitude modulated signal by signal pulses at the first level and the second level; receiving the second data from the second host system comprises receiving a second pulse amplitude modulated signal from the second host system that represents the second data; and values in the second data are represented in the second pulse amplitude modulated signal by signal pulses at the third level and the fourth level.

Example 17 includes the computer-readable storage medium of any one or more of Examples 15 or 16, wherein generating the composite signal comprises combining the first and second pulse amplitude modulated signals.

Example 18 includes the computer-readable storage medium of any one or more of Examples 15-17, wherein combining the first pulse amplitude modulated signal and second pulse amplitude modulated signal comprises time division multiplexing the first pulse amplitude modulated signal and second pulse amplitude modulated signal.

Example 19 includes the computer-readable storage medium of any one or more of Examples 15-18, wherein: the operations further comprise: generating a first signal based on the first data using the first level and second level; and generating a second signal based on the second data using the third level and the fourth level; the generating of the composite signal comprises time division multiplexing the first signal and the second signal.

Example 20 includes the computer-readable storage medium of any one or more of Examples 15-19, wherein: the first level represents a value of 0 in the first data received from the first host system; the second level represents a value of 1 in the first data received from the first host system; the third level represents a value of 0 in the second data received from the second host system; and the fourth level represents a value of 1 in the second data received from the second host system.

Figure 6:
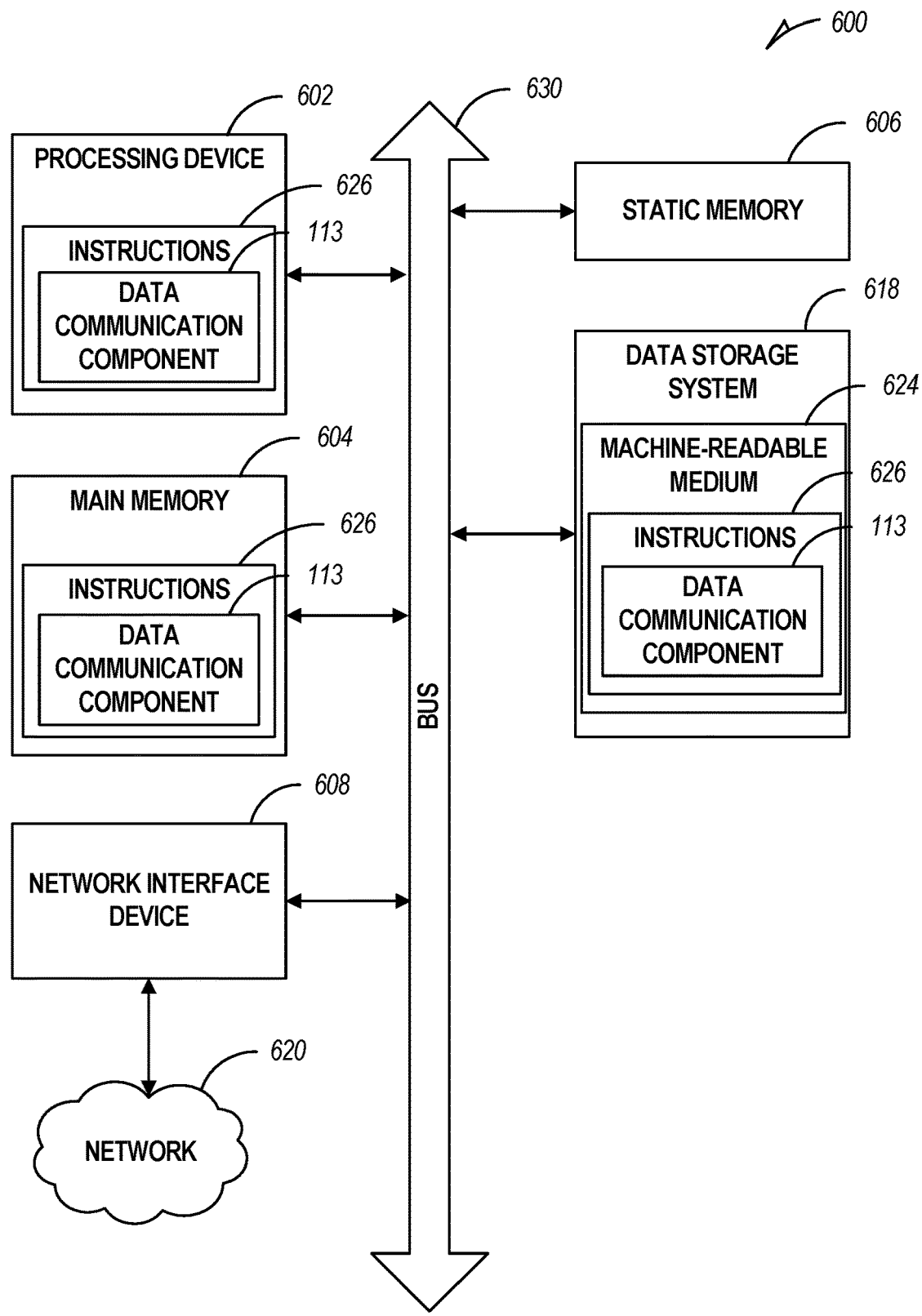
FIG. 6 is a block diagram of an example computer system in which embodiments of the present disclosure may operate.

FIG. 6 illustrates an example machine in the form of a computer system 600 within which a set of instructions can be executed for causing the machine to perform any one or more of the methodologies discussed herein. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the data communication component 113 of FIG. 1). In alternative embodiments, the machine can be connected (e.g., networked) to other machines in a local area network (LAN), an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., ROM, flash memory, DRAM such as SDRAM or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device 602 can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an ASIC, a FPGA, a digital signal processor (DSP), network processor, or the like. The processing device 602 is configured to execute instructions 626 for performing the operations and steps discussed herein. The computer system 600 can further include a network interface device 608 to communicate over a network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a data destruction component (e.g., the data communication component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks, ROMs, RAMs, EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any, particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine a computer) readable storage medium such as a ROM, RAM, magnetic disk storage media, optical storage media, flash memory components, and so forth.

In the foregoing specification, embodiments of the disclosure have been described with reference to specific example embodiments thereof. It will be evident that various modifications can be made thereto without departing from the broader scope of embodiments of the disclosure as set forth in the following claims. The specification and drawings are, accordingly, to be regarded in an illustrative sense rather than a restrictive sense.

What is claimed is:

1. A memory sub-system comprising:
a memory device; and
a processing device operatively coupled with a first host system and a second host system via a physical host interface, the processing device further operatively coupled with the memory device, the processing device to perform operations comprising:

receiving a first pulse amplitude modulated signal from the first host system via the physical host interface, the first pulse amplitude modulated signal representing first data from the first host system, values in the first data being represented in the first pulse amplitude modulated signal by signal pulses at a first level and a second level;

receiving a second pulse amplitude modulated signal from the second host system via the physical host interface, the second pulse amplitude modulated signal representing second data from the second host system, values in the second data being represented in the second pulse amplitude modulated signal by signal pulses at a third level and a fourth level, the first level, the second level, the third level, and the fourth level being different levels;

generating a composite signal that represents both the first data received from the first host system and the second data received from the second host system, the composite signal comprising a series of signal pulses at multiple levels, the first level and the second level in the multiple levels representing values in the first data from the first host system, the third level and the fourth level in the multiple levels representing values in the second data from the second host system; and providing the composite signal to the memory device.

2. The system of claim 1, wherein:
the first pulse amplitude modulated signal is generated by a first pulse amplitude modulator of the first host system based on the first data; and
the second pulse amplitude modulated signal is generated by a second pulse amplitude modulator of the second host system based on the second data.

3. The system of claim 1, wherein generating the composite signal comprises combining the first and second pulse amplitude modulated signals.

4. The system of claim 3, wherein combining the first pulse amplitude modulated signal and second pulse amplitude modulated signal comprises time division multiplexing the first pulse amplitude modulated signal and second pulse amplitude modulated signal.

5. The system of claim 1, wherein the operations further comprise:
assigning the first and second level to the first host system; and
assigning the third and fourth level to the second host system.

6. The system of claim 5, wherein the processing device comprises a time division multiplexer to perform the time division multiplexing of the first pulse amplitude modulated signal and the second pulse amplitude modulated signal.

7. The system of claim 1, wherein:
the first level corresponds to a first value in the first data from the first host system;
the second level corresponds to a second value in the first data from the first host system;
the third level corresponds to the first value in the second data from the second host system; and
the fourth level corresponds to the second value in the second data from the second host system.

8. A method comprising:
receiving, by a processing device operatively coupled with a first host system and a second host system via a physical host interface, a first pulse amplitude modulated signal, via the physical host interface, from the first host system to provide to a memory device, the first pulse amplitude modulated signal representing first data from the first host system, values in the first data being represented in the first pulse amplitude modulated signal by signal pulses at a first level and a second level;

receiving, by the processing device, a second pulse amplitude modulated signal, via the physical host interface, from the second host system to provide to the memory device, the second pulse amplitude modulated signal representing second data from the second host system, values in the second data being represented in the second pulse amplitude modulated signal by signal pulses at a third level and a fourth level, the first level, the second level, the third level, and the fourth level being different levels;

generating a composite signal that represents both the first data from the first host system and the second data from the second host system, the composite signal comprising a series of signal pulses at multiple levels, the first level and the second level in the multiple levels representing values in the first data from the first host system, the third level and the fourth level in the multiple levels representing values in the second data received from the second host system; and providing the composite signal to the memory device.

9. The method of claim 8, wherein:
the first pulse amplitude modulated signal is generated by a first pulse amplitude modulator of the first host system based on the first data; and
the second pulse amplitude modulated signal is generated by a second pulse amplitude modulator of the second host system based on the second data.

10. The method of claim 8, wherein generating the composite signal comprises combining the first and second pulse amplitude modulated signals.

11. The method of claim 8, further comprising:
assigning the first and second level to the first host system; and
assigning the third and fourth level to the second host system.

12. The method of claim 11, further comprising:
identifying, by the memory device, the first data from the composite signal based on the first level and the second level being assigned to the first host system; and
identifying, by the memory device, the second data from the composite signal based on the third level and the fourth level being assigned to the first host system.

13. The method of claim 8, wherein:
the first level corresponds to a first value in the first data from the first host system;
the second level corresponds to a second value in the first data from the first host system;
the third level corresponds to the first value in the second data from the second host system; and
the fourth level corresponds to the second value in the second data from the second host system.

14. The method of claim 8, wherein the composite signal further comprises signal pulses at a fifth level and a sixth level representing values from third data received from a third host system.

15. A non-transitory computer-readable storage medium comprising instructions that, when executed by a processing device operatively coupled with a first host system and a second host system via a physical host interface, configure the processing device to perform operations comprising:

receiving, via the physical host interface, a first pulse amplitude modulated signal from the first host system to provide to a memory device, the first pulse amplitude modulated signal representing first data from the first host system, values in the first data being represented in the first pulse amplitude modulated signal by signal pulses at a first level and a second level;

receiving, via the physical host interface, a second pulse amplitude modulated signal from the second host system to provide to the memory device, the second pulse amplitude modulated signal representing second data from the second host system, values in the second data being represented in the second pulse amplitude modulated signal by signal pulses at a third level and a fourth level, the first level, the second level, the third level, and the fourth level being different levels;

combining the first data and the second data to generate a composite signal that represents both the first data from the first host system and the second data from the second host system, the composite signal comprising a series of signal pulses at multiple levels, the first level and the second level in the multiple levels representing values in the first data from the first host system, the third level and the fourth level in the multiple levels representing values in the second data from the second host system; and transmitting the composite signal to the memory device.

16. The non-transitory computer-readable storage medium of claim 15, wherein:
the first pulse amplitude modulated signal is generated by a first pulse amplitude modulator of the first host system based on the first data; and
the second pulse amplitude modulated signal is generated by a second pulse amplitude modulator of the second host system based on the second data.

17. The non-transitory computer-readable storage medium of claim 15, wherein generating the composite signal comprises combining the first and second pulse amplitude modulated signals.

18. The non-transitory computer-readable storage medium of claim 17, wherein combining the first pulse amplitude modulated signal and second pulse amplitude modulated signal comprises time division multiplexing the first pulse amplitude modulated signal and second pulse amplitude modulated signal.

19. The non-transitory computer-readable storage medium of claim 15, wherein the operations further comprise:
assigning the first and second level to the first host system to enable the memory device to identify the first data from the composite signal; and
assigning the third and fourth level to the second host system to enable the memory device to identify the second data from the composite signal.

20. The non-transitory computer-readable storage medium of claim 15, wherein:
the first level represents a value of 0 in the first data from the first host system;
the second level represents a value of 1 in the first data from the first host system;
the third level represents a value of 0 in the second data from the second host system; and
the fourth level represents a value of 1 in the second data from the second host system.

* * * * *